US012730161B2

(12) United States Patent
Marcussen

(10) Patent No.: US 12,730,161 B2
(45) Date of Patent: Sep. 8, 2026

(54) RING CORE CURRENT TRANSDUCER FOR FLUX DETECTION

(71) Applicant: DANISENSE A/S, Taastrup (DK)

(72) Inventor: Andreas Marcussen, Frederiksberg (DK)

(73) Assignee: DANISENSE A/S, Taastrup (DK)

( * ) Notice: Subject to any disclaimer, the term of this patent is extended or adjusted under 35 U.S.C. 154(b) by 154 days.

(21) Appl. No.: 18/686,123

(22) PCT Filed: Aug. 26, 2022

(86) PCT No.: PCT/EP2022/073788
§ 371 (c)(1),
(2) Date: Feb. 23, 2024

(87) PCT Pub. No.: WO2023/025940
PCT Pub. Date: Mar. 2, 2023

(65) Prior Publication Data

US 2024/0426948 A1 Dec. 26, 2024

(30) Foreign Application Priority Data

Aug. 27, 2021 (EP) .................................... 21193443

(51) Int. Cl.
*G01R 33/00* (2006.01)
*G01R 15/18* (2006.01)
*G01R 33/04* (2006.01)

(52) U.S. Cl.
CPC ....... *G01R 33/0017* (2013.01); *G01R 15/185* (2013.01); *G01R 33/04* (2013.01)

(58) Field of Classification Search
CPC .... G01R 15/18; G01R 15/183; G01R 15/185; G01R 33/0017; G01R 33/007;
(Continued)

(56) References Cited

U.S. PATENT DOCUMENTS 4,293,815 A * 10/1981 West .................... G01R 33/045 33/312
6,278,272 B1 8/2001 Scarzello et al.
(Continued)

FOREIGN PATENT DOCUMENTS

EP 1067391 A1 1/2001
EP 3022744 B1 1/2018
(Continued)

OTHER PUBLICATIONS

International Search Report and Written Opinion of the International Searching Authority issued in corresponding International Application No. PCT/EP2022/073788, mailed on Mar. 2, 2023 (13 pages).

*Primary Examiner* — Huy Q Phan
*Assistant Examiner* — David B Frederiksen
(74) *Attorney, Agent, or Firm* — Dinsmore & Shohl LLP

(57) ABSTRACT

A current transducer for measuring the flux from a current carrying conductor, the current transducer comprising a sensor core for concentrating magnetic flux from said current carrying conductor, the sensor core being shaped as a loop broken by a gap. The current transducer further comprises a fluxgate ring core for sensing the magnetic flux, and two excitation coils for generating excitation flux in the ring core and for detecting the magnetic flux of the current carrying conductor. Drive means for driving an excitation current through the excitation coils are present along with a detection circuit connected to the excitation coils for detecting the electronic signal of the excitation coil. The fluxgate ring core is arranged in the gap of the sensor core, and the excitation coils are wound around a first and a second part of the fluxgate ring core, respectively. In some embodiments, a first and a second fluxgate ring core have excitation coils connected in series mounted in a first and a second gap
(Continued)

arranged directly across from each other in the sensor core of the current transducer.

19 Claims, 4 Drawing Sheets

(58) Field of Classification Search
CPC .... G01R 33/0076; G01R 33/02; G01R 33/04; G01R 33/045; G01D 5/12; G01D 5/14; G01D 5/16
See application file for complete search history.

(56) References Cited

U.S. PATENT DOCUMENTS

| | | | | |
|---|---|---|---|---|
| 6,411,078 | B1 * | 6/2002 | Nakagawa | G01R 15/183 324/117 H |
| 7,382,123 | B2 * | 6/2008 | Na | G01R 33/05 324/249 |
| 9,704,637 | B2 * | 7/2017 | van Vroonhoven | H01F 27/427 |
| 2011/0298454 | A1 * | 12/2011 | Ausserlechner | G01R 15/18 324/252 |
| 2012/0314332 | A1 | 12/2012 | Fries et al. | |
| 2013/0207651 | A1 | 8/2013 | Ruckert et al. | |
| 2014/0009143 | A1 * | 1/2014 | Blagojevic | G01R 33/04 324/244 |
| 2014/0055131 | A1 * | 2/2014 | Rybalko | G01R 33/02 324/253 |
| 2015/0016006 | A1 * | 1/2015 | van Vroonhoven | H01F 13/006 361/149 |
| 2015/0105630 | A1 * | 4/2015 | Kummerl | A61B 5/0205 600/502 |
| 2016/0033555 | A1 * | 2/2016 | Boettcher | G01R 15/207 324/117 R |
| 2019/0178917 | A1 | 6/2019 | Shimizu | |
| 2020/0400853 | A1 | 12/2020 | Zheng et al. | |

FOREIGN PATENT DOCUMENTS

| | | | |
|---|---|---|---|
| JP | 408015322 | | 1/1996 |
| JP | 2009063396 | | 9/2007 |
| JP | 2017181424 | A * | 10/2017 |
| WO | 2015009724 | A1 | 1/2015 |
| WO | 2017125728 | A1 | 7/2017 |

* cited by examiner

RING CORE CURRENT TRANSDUCER FOR FLUX DETECTION

CROSS-REFERENCE TO RELATED APPLICATIONS

The present application is a U.S. National Phase of International Application No. PCT/EP2022/073788, entitled “RING CORE CURRENT TRANSDUCER FOR FLUX DETECTION” and filed Aug. 26, 2022, which claims priority to EP Application Serial No. 21193443.5 filed on Aug. 27, 2021, the disclosure of both are incorporated herein by reference in their respective entireties.

TECHNICAL FIELD

The present invention relates to the field of current detection, more specifically to the field of current detection through magnetic flux sensing.

BACKGROUND OF THE INVENTION

Current transducers are known for detecting the current of a current carrying conductor such as a wire or a busbar without having to establish a direct electrical connection. Current transducers determine a primary current of a current carrying transducer by determining strength of the magnetic field emitted from the current carrying transducer.

Known current transducers of the fluxgate type typically comprise a core of a high magnetic permeability material shaped as a continuous loop which can be placed around the current carrying conductor. Typically, such fluxgate type current transducers further comprise two excitation coils for inducing magnetic fields in the core and a sensor coil for detecting the net magnetic flux in the core.

In typical fluxgate current transducers, the core forms a continuous loop that can be placed around a current carrying conductor, but such a configuration requires the transducer to be mounted before the current carrying conductor is connected to its power source. Split core current transducers where the structure can be opened and closed solves this problem by allowing the transducer to be placed around one current carrying conductor and moved to another one without having to disconnect the current carrying conductors.

While split core current transducers are practical for use with multiple current carrying conductors, current transducers that can be opened and closed pose several challenges. Splitting the core poses the risk of variations in how the loop is formed when it is closed again, which will affect the detection sensitivity. Some systems try to solve this by having multiple magnetometer cores mounted separately in the current transducer to avoid splitting of the magnetometer core itself, but using multiple separate magnetometer cores makes the current transducer more vulnerable to external fields and complicates the construction of the device.

SUMMARY OF THE INVENTION

It is an object of the present invention to provide a tool for reliably determining the current of a current carrying conductor by measuring the magnetic flux from that conductor.

The above object and advantages, together with numerous other objects and advantages, which will be evident from the description of the present invention, are according to a first aspect of the present invention obtained by:

A current transducer for measuring the flux from a current carrying conductor, the current transducer comprising

- a sensor core for concentrating magnetic flux from said current carrying conductor, said sensor core being shaped as a loop broken by a gap,
- a fluxgate ring core for sensing the magnetic flux,
- a first excitation coil for generating excitation flux in said ring core and for detecting the magnetic flux of the current carrying conductor,
- a second excitation coil for generating excitation flux in said ring core and for detecting the magnetic flux of the current carrying conductor,
- a drive means for driving an excitation current through said first excitation coil and said second excitation coil,
- a detection circuit connected to said first excitation coil and said second excitation coil for detecting the electronic signal of said first and said second excitation coil, said fluxgate ring core being arranged in the gap of said sensor core, and said first excitation coil being wound around a first part of said fluxgate ring core, and said second excitation coil being wound around a second part of said fluxgate ring core.

By a loop is understood a structure where the beginning is connected to the end to form an enclosure. In one preferred variant, the loop may be round but in other preferred variants it may have other shapes such as square. In a preferred variant, the loop of the sensor core is a regular shape, i.e. a circle or a geometric shape where all angles are the same.

By the loop being broken by a gap is understood a structure which would have formed a loop, but where a segment has been removed. In a preferred variant, the removed segment is at most a fifth of the length of the contour of the sensor core, such as a tenth of the length contour of the sensor core. By the gap is understood the region between the first end of the sensor core and the second end of the sensor core, such that the gap is the volume which the missing segment of the sensor core would have been had the sensor core been a closed loop with a continuous cross-sectional area from the first end of the sensor core to the second end of the sensor core.

By the fluxgate ring core being arranged in the gap of the sensor core is understood that the fluxgate ring core is located between the first end of the sensor core and the second end of the sensor core. In a preferred variant the fluxgate ring core is contained within the volume of the gap, i.e. the cross section of the of the fluxgate ring core is smaller than or equal to the cross section of the sensor core. In some of such preferred variants where the fluxgate ring core does not extend beyond the gap, the first and second excitation coils wound around the fluxgate ring core may extend outside the volume of the gap, even though the fluxgate ring core itself does not. In another variant, the fluxgate ring core may be arranged between the first end of the sensor core and the second end of the sensor core and extending beyond the gap in a direction perpendicular to the end surfaces of the first end of the sensor core and the second end of the sensor core.

Having the fluxgate ring core mounted in the gap of the sensor core provides several benefits. The sensor core can be arranged around the current carrying conductor, such that the current carrying conductor is in the opening enclosed by the loop which the sensor core forms. The sensor core being made from a magnetic material concentrates the magnetic field of the current carrying conductor. The magnetic field is directed to the fluxgate ring core by the sensor core thereby increasing the sensitivity. Furthermore, as the sensor core concentrates the magnetic field, it also decreases vulnerability to external fields and to noncentral alignment of the current carrying conductor within the sensor core opening. Having the fluxgate ring core located in the gap rather than being an integrated part of the sensor core decreases the amount of noise from the excitation flux induced by the first and second excitation coil which can enter the sensor core.

Furthermore, having the fluxgate ring core placed in the gap of the sensor core enables the use of identical fluxgate ring core structures with varying size of the sensor core. The sensor core may be scaled up or down to allow for different sizes of current carrying conductors to be enclosed in the sensor core opening. Preferably, the height of the gap, i.e. the distance between the first end of the sensor core and the second end of the sensor core may be the same between different variants of the current transducer, such that identical fluxgate ring core configurations may be used with different sensor core dimensions. Thereby, the production of current transducers compatible with different current conductors is simplified.

In a preferred variant, the drive means is a modulator for controlling the current driven through the first and second excitation coil.

By having a detection circuit connected directly to the first excitation coil and the second excitation coil, it is possible to measure the magnetic flux of the current carrying conductor based on the electrical signal of the first excitation coil and the second excitation coil. The primary current may be computed based on the measured flux and the flux may be determined by monitoring the difference in electric signal, i.e. current and voltage, of the first and second excitation coils. Thus, in a preferred variant, the current transducer comprises no dedicated sensor coil. By determining the flux directly from the signal of the first and second excitation coils, the system is simplified as a sensor coil may be foregone. The signal strength is increased by measuring the flux directly on the fluxgate ring core compared to either on the sensor core or at a further distance as necessary with a sensor coil wound around outside the first and second excitation coils.

In a preferred variant, the first excitation coil and the second excitation coil are wound around the fluxgate ring core such that they are equally spaced on the fluxgate ring core, in other words, the distance between either end of the first excitation coil to the closest end of the second excitation coil is the same.

According to a further embodiment of the first aspect of the invention, the detecting circuit comprising a second harmonic detector for demodulating the difference in the respective currents of the first excitation coil and the second excitation coil.

By using second harmonic detection for determining the difference in electrical signals from the first and second excitation coils, it is possible to detect the magnetic flux of the current carrying conductor even with a current transducer with low sensitivity. The second harmonic detection reduces adverse effects of noise in the current transducer. Furthermore, temperature drift in the current transducer is decreased due to the symmetry of the second harmonic detection which runs in full saturation in both directions.

In another variant of the current transducer, the detection circuit comprises an edge time difference detector. In yet other variants, other known methods of demodulating the current signals of the first and second excitation coils may be used.

According to a further embodiment of the first aspect of the invention, the fluxgate ring core is made of a magnetic material with a relative permeability of at least 100,000.

By constructing the fluxgate ring core of magnetic material with a high relative permeability the magnetic resistance becomes low in the fluxgate ring core. In addition, the small dimensions of the fluxgate ring core provide only a short path through the magnetic material. These features promote the confinement of the excitation flux in the fluxgate ring core. Confining the excitation flux to the fluxgate ring core is preferable, as the excitation flux travelling into the sensor core becomes a source of noise with respect to the flux picked up from the current carrying conductor.

The magnetic material of the fluxgate ring core is further made of a low-loss material such that the power loss is minimized at the excitation frequency. While the high permeability contributes to localizing the excitation flux, minimizing the loss of the flux to the material of the fluxgate ring core enables the use of high excitation frequency, thereby increasing the bandwidth at which the primary current can be detected. In a preferred variant, the excitation frequency is at least 32 kHz. In other preferred variants, the excitation frequency is 128 kHz or more.

Some variants of the current transducer may comprise filters for suppressing excitation noise in the electronics of the system.

According to a further embodiment of the first aspect of the invention, the fluxgate ring core is made of a cobalt based amorphous metal alloy.

According to a further embodiment of the first aspect of the invention, the sensor core being made of a magnetic material with a permeability lower than the relative permeability of the fluxgate ring core.

While it is preferable that the permeability of the sensor core is high, choosing the magnetic material of the sensor core such that the relative permeability of the sensor core is lower than the relative permeability of the fluxgate ring core has several benefits.

Firstly, magnetic materials with lower relative permeability are usually cheaper than those with higher relative permeability and by making the larger sensor core of a cheaper material costs of the current transducer may be kept low.

Secondly, having a higher relative permeability in the fluxgate ring core further promotes confining the excitation flux to the fluxgate ring core. Thereby, the noise of the excitation flux entering the sensor core is minimised. Furthermore, the primary flux from the current carrying conductor picked up by the sensor core will follow the path of least magnetic resistance to the fluxgate ring core, wherefrom it will be measured by the detection circuit.

According to a further embodiment of the first aspect of the invention, the sensor core is made of Mu-metal.

According to a further embodiment of the first aspect of the invention, the current transducer comprises shielding for protecting against external magnetic fields and reducing noise, the shielding encapsulating the sensor core, the fluxgate ring core, the first excitation coil, and the second excitation coil together.

The system is sensitive to external magnetic fields such as fields of nearby electronics as well as the magnetic field of the Earth. By encapsulating the components of the current transducer, sensitivity to such unwanted fields may be reduced. The sensor core, the fluxgate ring core and the first and second excitation coils are enclosed in the shielding together, such that the exchange of flux between those components are not limited by the shielding and such that if any external fields enter the current transducer they will be guided away from the sensor and fluxgate ring core using the shield.

In some variants of the first aspect of the invention, the shielding comprises an inner shield core, an outer shield core, a top shield plate and a bottom shield plate.

According to a further embodiment of the first aspect of the invention, the shielding is made from a material with a lower relative permeability than both that of said sensor core and that of the fluxgate ring core.

In a preferred variant, the shielding is made from a material with a higher saturation flux density than the saturation flux density of both that of the sensor core and that of the fluxgate ring core.

For the shielding to effectively protect against external magnetic fields, it must be made from a material with suitable characteristics. High saturation flux density of the shielding ensures that the shielding is capable of shielding against strong external magnetic fields, as fields can pass through the shielding once the material is saturated. Commonly materials with high saturation flux density will have low relative permeability. Furthermore, materials with low relative permeability are often cheaper than those with higher relative permeability and choosing a material with low relative permeability thus contributes to lowering the cost of the current transducer.

In a preferred variant, the shielding and the sensor core are spaced apart such that they are not in direct physical or electrical contact. In some variants, the spacing between the shielding and the sensor core as well as the distance between the shielding and the fluxgate ring core is at least half the thickness of the shielding material. In another preferred variant, the distance between the shielding and the sensor core as well as the distance between the shielding and the fluxgate ring core is at least 1 mm.

If the distance between the shielding and the sensor core and/or the fluxgate ring core is too small, the external magnetic fields may be transferred from the shielding to the sensor core and/or the fluxgate ring core. Thus, a minimum distance is required for the shielding to effectively protect against external magnetic fields.

According to a further embodiment of the first aspect of the invention, the shield is made from electrical steel.

By an electrical steel is understood an iron alloy comprising iron and up to 7% silicon.

According to a further embodiment of the first aspect of the invention, the current transducer comprises a compensation coil for inducing a counteracting current and maintaining a near zero flux in the fluxgate ring core, said compensation coil being wound around said shielding around said sensor core.

The compensation coil enables the current transducer to operate at zero flux. The compensation coil is connected to the detection circuit and a current is directed through the compensation coil, such that the flux generated by the compensation coil outbalances the field from the primary current, such that the magnetometer output remains zero. Operating at a net zero flux ensures that the magnetic material of the fluxgate ring core avoids saturation, even if the magnetic field of the current carrying conductor is large enough that it would otherwise saturate the magnetometer. Thus, the compensation coil contributes to increasing the dynamic range of the current transducer.

By winding the compensation coil around the shielding, the shielding too is affected by the compensation current. Hence, the compensation coil also contributes to counteracting magnetisation of the shielding.

The shielding has the further benefit of acting as a hollow transformer core for high frequencies for the compensation coil wound around it.

According to a further embodiment of the first aspect of the invention, the current transducer comprises a degaussing circuit for removing remnant magnetic flux in the current transducer, the degaussing circuit being connected to the compensation coil.

By a degaussing circuit is understood a circuit for controlling the activation of a degaussing signal being driven through said compensation coil. By a degaussing signal is understood an alternating current high enough to counteract the remnant magnetic flux in the magnetic material of the current transducer. Magnetic materials may retain remnant magnetic flux after being subjected to magnetic fields. The stronger the magnetic fields the materials are subjected to, the more likely it is that remnant magnetic flux is retained in the material even when compensating systems such as compensation coils and shielding are in place. The degaussing circuit is in particular beneficial in case problems have arisen with the compensation coil and/or it has temporarily been turned off or in situations where the current transducer has been subjected to magnetic fields exceeding the magnitude of what can be compensated for by the compensation coil.

In some variants, the current transducer comprises a first spacer and a second spacer for spacing the fluxgate ring core apart from the sensor core, the first spacer being located between a first end of the sensor core and the fluxgate ring core, and the second spacer being located between a second end of the sensor core and the fluxgate ring core.

By a spacer is understood any component that keeps the sensor core from being in direct contact with the fluxgate ring core. In one preferred variant, the spacer may be part of a holder for mounting the fluxgate ring core in the gap of the sensor core. In another preferred variant, the spacer may be a part of a shielding structure. In yet another preferred variant, a first and a second spacer may be separate components with the sole purpose of creating additional spacing. However, it is to be understood that the first spacer and the second spacer may be connected, e.g. being opposing sides of a holder.

The excitation flux induced in the fluxgate ring core by the first and second excitation coils is a source of noise with respect to detected flux from the current carrying conductor. Having the first and second spacers between the fluxgate ring core and the sensor core contributes to containing the excitation flux in the fluxgate ring core and thereby minimising any excitation flux entering the sensor core.

In some variants of the current transducer, the effect of the first and second spacer may supplement the benefits of the sensor core and the fluxgate ring core being made from different materials. In other variants of the current transducer the first and second spacer may provide an appropriate decoupling of the sensor core and fluxgate ring core while they are made from the same material.

According to a further embodiment of the first aspect of the invention, the thickness of the first spacer is at most 50 μm and the thickness of the second spacer is at most 50 μm.

The spacing between the sensor core and the fluxgate sensor core leads to a decreased magnetic coupling between the sensor core and the fluxgate core sensor. While this contributes to containing the excitation flux in the fluxgate ring core, it also leads to a reduction of the amount of sensed flux from the current carrying conductor which is transferred from the sensor core to the fluxgate ring core. Hence, it is important that the first spacer and the second spacer each have a minimal thickness, i.e. that the distance between the fluxgate ring core and the sensor core is small. The thicknesses of each of the first spacer and the second spacer at or below 50 μm are suitable for directing the magnetic flux into the fluxgate ring core while noise from the excitation flux is kept at a minimum.

In some preferred variants, the current transducer comprises no spacers between the fluxgate ring core apart from the sensor core. Such variants may be considered similar to having a first and a second spacer each with a thickness of 0 μm.

When there are no spacers, the coupling between the sensor core and the fluxgate ring core sensor are improved. In such variants, the difference in material choice, and thereby magnetic properties of the materials, is sufficient to avoid the adverse effects of excitation flux leaking into the sensor core.

According to a further variant, the current transducer comprises two or more fluxgate ring cores, said fluxgate ring cores being evenly distributed along the sensor core.

By the fluxgate ring cores being evenly distributed along the sensor core is to be understood that the sections of sensor core between each fluxgate ring core are equally long.

In a preferred variant, the sensor core comprises two fluxgate ring cores that are located directly across from each other; in other words, the fluxgate ring cores are placed at each end of a diameter of the sensor core. In such a configuration, the sensor core comprises two gaps and the fluxgate ring cores are mounted in those gaps.

Each of the two or more fluxgate ring cores are configured as the fluxgate ring core previously described. For example, it is to be understood that each of the fluxgate ring cores comprises a first excitation coil and a second excitation coil wound around the fluxgate ring cores, and in the case of shielding that all fluxgate ring cores are encompassed by the shielding of the current transducer.

Including two or more fluxgate rings cores has the benefit of further mitigating the effect of external magnetic fields, as variation across the current transducer will be detected and may be compensated for.

According to a further embodiment of the first aspect of the invention, the current transducer comprises a second fluxgate ring core for sensing the magnetic flux, said second fluxgate being arranged directly across from said fluxgate ring core and being located in a second gap of said sensor core,

- a third excitation coil for generating excitation flux in said second ring core and for detecting the magnetic flux of the current carrying conductor,
- a fourth excitation coil for generating excitation flux in said second ring core and for detecting the magnetic flux of the current carrying conductor.

By the fluxgate ring, cores are placed at each end of a diameter of the sensor core. The other fluxgate ring core, also called the first fluxgate ring core, is spaced apart from the second fluxgate ring core by 180 degrees along the loop of the sensor core.

The mounting of the second fluxgate ring core in the second gap is equivalent to the previously described mounting of the fluxgate ring core in the gap.

Having a first and a second fluxgate ring core arranged directly opposite each other in the path of the sensor core has the benefit of decreasing the impact of external magnetic fields, which would otherwise cause noise in the measurement. Having the first and second fluxgate placed directly opposite each other means that an external magnetic field will affect the first and the second ring core differently and thus reduce the effect caused by the external field. In the ideal case where the external field is a large homogenous magnetic field, it will affect the first and the second fluxgate ring core with the same magnitude of field while the filed will be applied in opposite directions. Hence, external fields sensed by the first fluxgate ring core and the second fluxgate ring core will cancel each other out. At the same time, the field generated by the current carrying conductor being picked up by the sensor core will be detected by both the first flux core current transducer and the second flux core current transducer without cancelling each other out, as the flux is directed unidirectionally around the sensor core.

In a preferred variant, the fluxgate ring core, also called the first fluxgate ring core, and the second fluxgate ring core are made from the same material and have the same proportions as each other, thereby providing measurement symmetry. In such preferred variants, the third and fourth excitation coils are equivalent to the first and second excitation coils, e.g. they have the same number of windings and are made from the same type of wire.

In a preferred variant, the first excitation coil and the third excitation coil are electrically connected in series and the second excitation coil and the fourth excitation coil are electrically connected in series. By such connection, it is possible to electrically drive the excitation coils of the first and second fluxgate ring cores at the same time and in the same manner. This simplifies the operation of the current transducer and minimizes the necessary equipment.

According to some preferred variants there will be

- a current transducer for measuring the flux from a current carrying conductor, the current transducer comprising
  - a sensor core for concentrating magnetic flux from said current carrying conductor, said sensor core being shaped as a loop broken by a first gap and a second gap located directly opposite each other,
  - a first fluxgate ring core for sensing the magnetic flux,
  - a first excitation coil for generating excitation flux in said first ring core and for detecting the magnetic flux of the current carrying conductor,
  - a second excitation coil for generating excitation flux in said first ring core and for detecting the magnetic flux of the current carrying conductor,
  - said first fluxgate ring core being arranged in said first gap of said sensor core, and
- said first excitation coil being wound around a first part of said fluxgate ring core, and
- said second excitation coil being wound around a second part of said fluxgate ring core
  - a second fluxgate ring core for sensing the magnetic flux,
  - a third excitation coil for generating excitation flux in said second ring core and for detecting the magnetic flux of the current carrying conductor,
  - a fourth excitation coil for generating excitation flux in said second ring core and for detecting the magnetic flux of the current carrying conductor,
  - said second fluxgate ring core being arranged in said second gap of said sensor core, and
- said third excitation coil being wound around a first part of said second fluxgate ring core, and
- said fourth excitation coil being wound around a second part of said second fluxgate ring core
  - a drive means for driving an excitation current through said first excitation coil,
- said second excitation coil, said third excitation coil and said fourth excitation coil,
  - a detection circuit connected to said first excitation coil, said second excitation coil, said third excitation coil and said fourth excitation coil for detecting the electronic signal of said first and said second excitation coil.

According to a further embodiment of the first aspect of the invention, the current transducer is a split core current transducer.

By a split core current transducer is understood a system where the closed loop of the sensor core and fluxgate ring core is reattachably broken, such that it is possible to open the loop of the current transducer to place it around a current carrying conductor and then reattach the parts of the current transducer around the current carrying conductor. Thus, having a split core current transducer makes it possible to arrange the current transducer around a current carrying conductor without having to rearrange the current carrying conductor itself. This also makes it easy to use the same current transducer for measuring the primary current of various different current carrying conductors, as it is easy to move the current transducer from one current carrying conductor to another.

In one preferred variant, the split core current transducer comprises a first split and a second split for splitting the parts of said split core current transducer, both said first split and said second split being located on the sensor core.

By the first and the second split being located in the sensor core is understood that both the first and the second split have sensor cores on either side. Thus, both the first and the second split are located away from the fluxgate ring core such that the split does not increase the size of the gap. By having the first and second split located in the sensor core away from the gap, it is possible to maintain enclosing shielding around the fluxgate ring core at all times when using the current transducer including when the split core current transducer is opened and closed, e.g. to place it around the current carrying conductor.

The sensor core is less sensitive to imprecisions in the reattachable closing mechanism than the fluxgate ring core would be. Thus, sensing the field in the gap of the sensor core, rather than surrounding the current carrying conductor with a fluxgate ring core, enables the inclusion of the split without altering the characteristics of the fluxgate ring core.

In such variants of the current transducer comprising multiple fluxgate ring cores, each of these fluxgate ring cores are located away from the splits of the split core current transducer. For example, in a preferred variant with two fluxgate ring cores, said fluxgate ring cores are located directly across from each other that is 180 degrees from each other along the sensor core, while the splits similarly are located directly across from each other and approximately 90 degrees away from the fluxgate ring cores.

In variants comprising three or more fluxgate ring cores, the fluxgate ring cores will not be equidistant with respect to the splits, but in preferred variants, the splits will be located such that the distance between fluxgate ring cores and splits are maximized.

In another preferred variant, the split core current transducer comprises a first split and a second split for splitting the parts of said split core current transducer, said first split being located between said fluxgate ring core and said sensor core.

In such variants including two fluxgate ring cores, the first split will be located between a first fluxgate ring core and the sensor core, while the second split will be located between a second fluxgate ring core and the sensor core. In variants with more than two fluxgate ring cores, at least the first split is located between a fluxgate ring core and the sensor core, while the second split may be located elsewhere in the sensor core.

According to a further embodiment of the first aspect of the invention, the current transducer comprises a feedback coil for improving the accuracy of said current transducer.

The feedback coil is suited for sensing alternating flux, i.e. the magnetic flux generated from an alternating current. Including the feedback coil improves the midrange frequency accuracy. The signal measured by the feedback coil is added to the signal of the magnetometer in the data processing of the detection circuit, thereby increasing the accuracy of the middle range frequency of the final output of the detection.

In a preferred variant, the feedback coil is wound around the shielding around the sensor core.

Another object of the present invention is to provide a method for determining the current of a current carrying conductor by measuring the magnetic flux from that conductor.

According to a second aspect of the present invention, the above objects and advantages are obtained by:

A method for detecting the primary current flow through a current carrying conductor, the method comprising providing a current carrying conductor for carrying a primary current, providing a current transducer comprising a sensor core, a fluxgate ring core, a first excitation coil and second excitation coil, placing the sensor core around the current carrying conductor such that the sensor core can sense magnetic flux emitted from the current carrying conductor, connecting the first excitation coil and the second excitation coil to a drive means and driving excitation current through the first and the second excitation coil such that an excitation flux is induced in the fluxgate ring core, connecting the first excitation coil and the second excitation coil to a detection circuit and using the second harmonic detection to determine the difference in current through the first excitation coil and the second excitation coil, computing the primary current of the current carrying conductor based on the second harmonic detection of the current difference.

Applying a second harmonic detection to the excitation current when determining the primary current based on the current difference in excitation current through the first and second excitation coils increases the accuracy of the detection method.

According to a further embodiment of the second aspect of the invention, the method further comprises driving the excitation current through a third and a fourth excitation coil provided in a second fluxgate ring core of said current transducer, such that an excitation flux is induced in said second fluxgate ring core, and connecting said third excitation coil and said fourth excitation coil in series with said first excitation coil and said second excitation coil such that said third excitation coil and said fourth excitation coil are connected to said detection circuit, whereby the difference in current is determined between the first combined system of said first excitation coil and said third excitation coil and the combined system of said second excitation could and said fourth excitation coil.

Forming a first combined system of the first excitation coil and the third excitation coil and a second combined system of the second excitation coil and the fourth excitation coil by serial connection of the respective excitation coils has several benefits. The first fluxgate ring core and the second fluxgate ring core may be driven by the same drive means thereby simplifying the electrical connection. Furthermore, the same detection circuit may be used to detect the combined measurement of the first fluxgate ring core and the second fluxgate ring core this makes the necessary circuitry simple and also the necessary computations made on the collected measurements are not complicated by the presence of multiple fluxgate ring cores.

According to a further embodiment of the second aspect of the invention, the excitation current driven through said first and said second excitation coils being an alternating current.

In a preferred variant, the alternating excitation current drives the first and the second excitation coil, such that the magnetic material of the fluxgate ring core is brought into deep saturation in both directions. By driving the fluxgate ring core at alternating deep saturation, any thermal offset drift in the fluxgate ring core is minimised, thereby increasing the reliability of the measurements performed by the current transducer.

According to a further embodiment of the second aspect of the invention, the method comprises providing a compensation coil around the sensor core, and driving a compensation current through the compensation coil, the compensation current being determined based on the output of the detection circuit such that the primary flux of the primary current is compensated by the compensation flux of the compensation current through the compensation coil.

According to a further embodiment of the second aspect of the invention, a degaussing signal is sent through said compensation coil for removing remnant magnetic flux residing in the materials of said current transducer.

Magnetic materials may retain remnant magnetic flux after being subjected to magnetic fields. The stronger the magnetic fields the materials are subjected to, the more likely it is that remnant magnetic flux is retained in the material even when compensating systems such as compensation coils and shielding are in place. By a degaussing signal is understood an alternating current high enough to counteract the remnant magnetic flux in the magnetic material of the current transducer.

In a preferred variant, the degaussing signal may be manually activated by a user such that it is introduced when a user observes the need for counteracting for remnant magnetic flux. In another preferred variant, a degaussing signal is automatically activated if the output offset current exceeded a predefined threshold.

SHORT LIST OF THE DRAWINGS

In the following, examples of embodiments are described according to the invention, where:

DETAILED DESCRIPTION OF THE DRAWINGS

Figure 1:
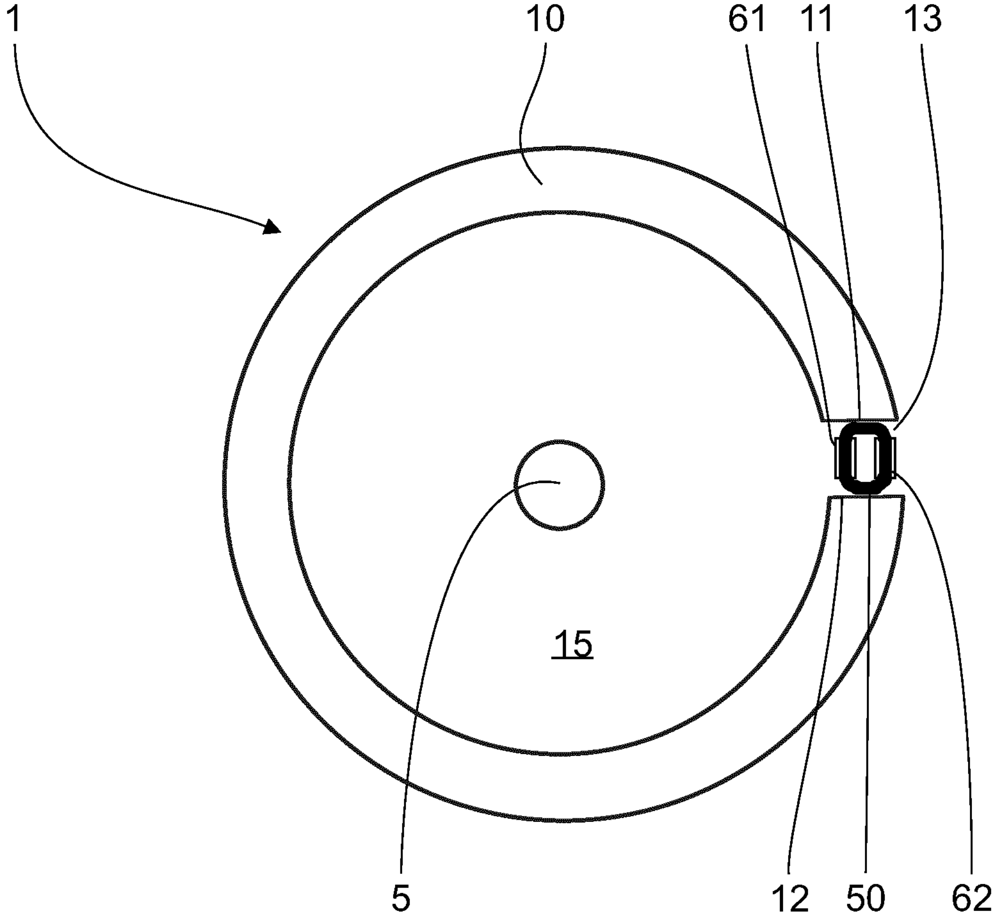
FIG. 1 is a schematic illustration of a cross-sectional view of a current transducer placed around a current carrying conductor.

The invention will now be explained in more detail below by means of examples with reference to the accompanying drawings.

The invention may, however, be embodied in different forms than depicted below, and should not be construed as limited to any examples set forth herein. Rather, any examples are provided so that the disclosure will be thorough and complete, and will fully convey the scope of the invention to those skilled in the art. Like reference numerals refer to like elements throughout. Like elements will, thus, not be described in detail with respect to the description of each figure. A detailed description of embodiments of the ring core fluxgate current transducer as well as a method for use of such a system will be provided.

FIG. 1 shows a schematic illustration of the components of a current transducer 1 in its simplest form, shown in a cross section.

The sensor core 10 is made from a magnetic material and forms a loop broken by a gap 13. By a loop is understood a structure where the beginning is connected to the end to form an enclosure. By the loop being broken by a gap is understood a structure which would have formed a loop, but where a segment has been removed. By the gap 13 is understood the region between the first end of the sensor core 11 and the second end of the sensor core 12, such that the gap 13 is the volume, which the missing segment of the sensor core would have occupied, had the sensor core 10 been a closed loop with a continuous cross-sectional area from the first end of the sensor core 11 to the second end of the sensor core 12. In a preferred embodiment, the cross-sectional area of the sensor core 10 is constant along the length of the sensor core 10.

The sensor core 10 is placed around the current carrying conductor 5, such that part of the current carrying conductor 5 is located in the opening 15 of the sensor core 10. By the opening 15 of the sensor core 10 is understood the area delimited by the loop of the sensor core 10.

In a preferred variant, the current carrying conductor 5 is centred in the sensor core opening 15 during measurements. For example, this may be the case where the diameter of the current carrying conductor 5 matches the diameter of the sensor core opening 15, alternatively the current transducer 1 may be mounted on an external post (not shown) holding it in the preferred position. While it is optimal to have the current carrying conductor 5 cantered with respect to the sensor core opening 15, the current transducer 1 will also function with a less optimal placement, e.g. the sensor core part of the current transducer hanging on the current carrying conductor in an off-centre manner.

In a preferred embodiment, the sensor core 10 is circular. In other embodiments, the sensor core 10 may have another shape, such as square or hexagonal. In preferable variants, the shape of the sensor core is regular.

A fluxgate ring core 50 is arranged in the gap 13 of the sensor core 10. By the fluxgate ring core being arranged in the gap of the sensor core is understood that the fluxgate ring core is located between the first end of the sensor core 11 and the second end of the sensor core 12. In a preferred variant, the fluxgate ring core is contained within the volume of the gap 13.

In FIG. 1, the fluxgate ring core is illustrated oriented with its loop parallel to the loop of the sensor core. This is an illustration of one possible orientation. In another preferred embodiment of the current transducer, the fluxgate ring core is oriented such that the loop of the fluxgate ring core is perpendicular to the loop of the sensor core, thereby having the first excitation coil and the second excitation coil placed equidistant with respect to the current carrying conductor. In yet other preferred embodiments, the fluxgate ring core 50 may be oriented at any other angle with respect to the orientation of the sensor core 10, i.e. in between parallel and perpendicular.

The fluxgate ring core 50 forms a closed loop. In a preferred embodiment, the loop of the fluxgate ring core 50 is oval as illustrated in FIG. 1. The fluxgate ring core 50 may take other shapes forming a loop. In some preferred embodiments, the fluxgate ring core 50 comprises two elongated parts, which are substantially parallel around which the first excitation coil 61 and the second excitation coil 62 are wound, respectively. Such a shape may be a stadium geometry, or it may be a rectangle with rounded corners while not being semicircles. In yet other preferred variants, the fluxgate ring core 50 may be a loop formed by a square or a rectangle. In another embodiment, the fluxgate ring core is circular. In preferred embodiments, the elongated parts around which the first 61 and second excitation coil 62 are wound are oriented along the field of the sensor core 10 when the fluxgate ring core is mounted in the gap 13. In other words, the part of the fluxgate ring core 50, which the first 61 and second excitation coil 62 are wound around, extends substantially in a direction from the first end of the sensor core 11 to the second end of the sensor core 12.

In a preferred embodiment, the fluxgate ring core 50 along with any mounting means 20 mechanically connects the first end of the sensor core 11 and the second end of the sensor core 12, such that the current transducer 1 forms a looping structure.

A first excitation coil 61 is wound around a first part of the fluxgate ring core 50 and a second excitation coil 62 is wound around a second part of the fluxgate ring core 50, such that the first coil 61 and the second excitation coil 62 do not overlap. In a preferred embodiment, the first excitation coil 61 and the second excitation coil 62 are located opposite to each other, i.e. the spacing between the first excitation coil 61 and the second excitation coil 62 is the same on either side of the excitation coils, in other words, they are evenly spaced on the fluxgate ring core 50. In a preferred embodiment, the number of windings in the first excitation coil 61 is equivalent to the number of windings in the second excitation coil 62.

While not shown in the schematic representation of FIG. 1 in a preferred embodiment of the current transducer 1, the fluxgate ring coil 50 is mounted in the gap 13 by mounting means 20. Such mounting means 20 may be a holder encapsulating the fluxgate ring core 50; it may be a small support covering only part of the fluxgate ring core 50 or it may be spacing elements ensuring a friction fit of the fluxgate ring core 50 within the gap 13. In some preferred variants, the mounting means 20 are also used as a bobbin for the first coil 61 and the second excitation coil 62. In a preferred variant, the mounting means 20 are made from a non-magnetic material, such that they do not interfere with the magnetic flux.

In some embodiments of the current transducer 1, there is a first spacer located between the first end of said sensor core 11 and the fluxgate ring core 50 and a second spacer located between the second end of said sensor core 12 and said fluxgate ring core 50. In preferred variants of the current transducer 1, the first spacer and the second spacer are parts of the holding means. In other variants, the first and second spacer may be separate components for controlling the distance between fluxgate ring core 50 and respectively the first 11 and the second end of the sensor core 12. In a preferred variant of such an embodiment, the thickness of the first spacer does not exceed 50 μm and the thickness of the second spacer does not exceed 50 μm. In some preferred variants, the thickness of the first spacer is the same as the thickness of the second spacer.

In other embodiments, the current transducer 1 comprises no spacers. In such embodiments, the holding means 20 are arranged such that they do not space apart the fluxgate ring core 50 and the sensor core 10. For example, the holding means may be connected to the shielding and/or to the centre of the fluxgate ring core 50.

In some variants, the current transducer 1 may not require holding means 20, as the fluxgate ring core 50 is mounted in the gap 13 of the sensor core 10 by direct contact between the fluxgate ring core 50 and the first end 11 and the second end 12 of the sensor core.

The combined system of the fluxgate ring core 50 along with the first excitation coil 61 and the second excitation coil 62 connected to a drive means and a detection circuit is considered a magnetometer, as it is capable of detecting magnetic field. The other components of the current transducer 1 contribute to improving the output of the magnetometer.

The current carrying conductor 5 carries the primary current, which the current transducer 1 is meant to determine. The primary current gives rise to a primary flux also called the primary magnetic flux. The primary flux is measured by the magnetometer of the current transducer 1 and the primary current can then be computed based on the detected flux.

When a primary current travels along the current carrying conductor 5, a magnetic field is generated. The sensor core 10 being made form a magnetic material, receives the primary magnetic flux which then travels along the sensor core 10. As the primary magnetic flux travels along the sensor core 10, it will reach the fluxgate ring core 50 located in the gap 13 of the sensor core 10.

In a preferred embodiment, the fluxgate ring core 50 is made from a material with high relative permeability of at least 100,000 and which is low-loss at the excitation frequency of first 61 and second excitation coil 62. In a preferred variant, the fluxgate ring core 50 is made of a cobalt based amorphous metal alloy, which has such features of low loss and high relative permeability. Furthermore, the dimensions of the fluxgate ring core 50, e.g. the diameter or the cross-sectional area, are small compared to those of the sensor core 10 as required for the fluxgate ring core 50 to be located in the gap 13 of the sensor core 10.

In a preferred embodiment, the current driven through the fluxgate ring core 50 is sufficient such that the excitation flux drives the fluxgate ring core 50 into deep magnetic saturation. In preferred embodiments, alternating current is used to drive the excitation flux, whereby the induced saturation will also be alternating. The alternating direction of the saturation leads to a low thermal offset drift in the fluxgate ring core 50.

Because of the material and dimensions of the fluxgate ring core 50 leading to low magnetic resistance in the fluxgate ring core 50, the magnetic flux in the sensor core 10 will flow to the fluxgate ring core such that the primary magnetic flux is concentrated in the fluxgate ring core 50. In a preferred embodiment, the relative permeability of the sensor core 10 is lower than the relative permeability of the fluxgate ring core 50, thereby further enhancing the effect of concentrating the flux in the fluxgate ring core 50. The sensor core may for example be made from Mu-metal.

Figure 2:
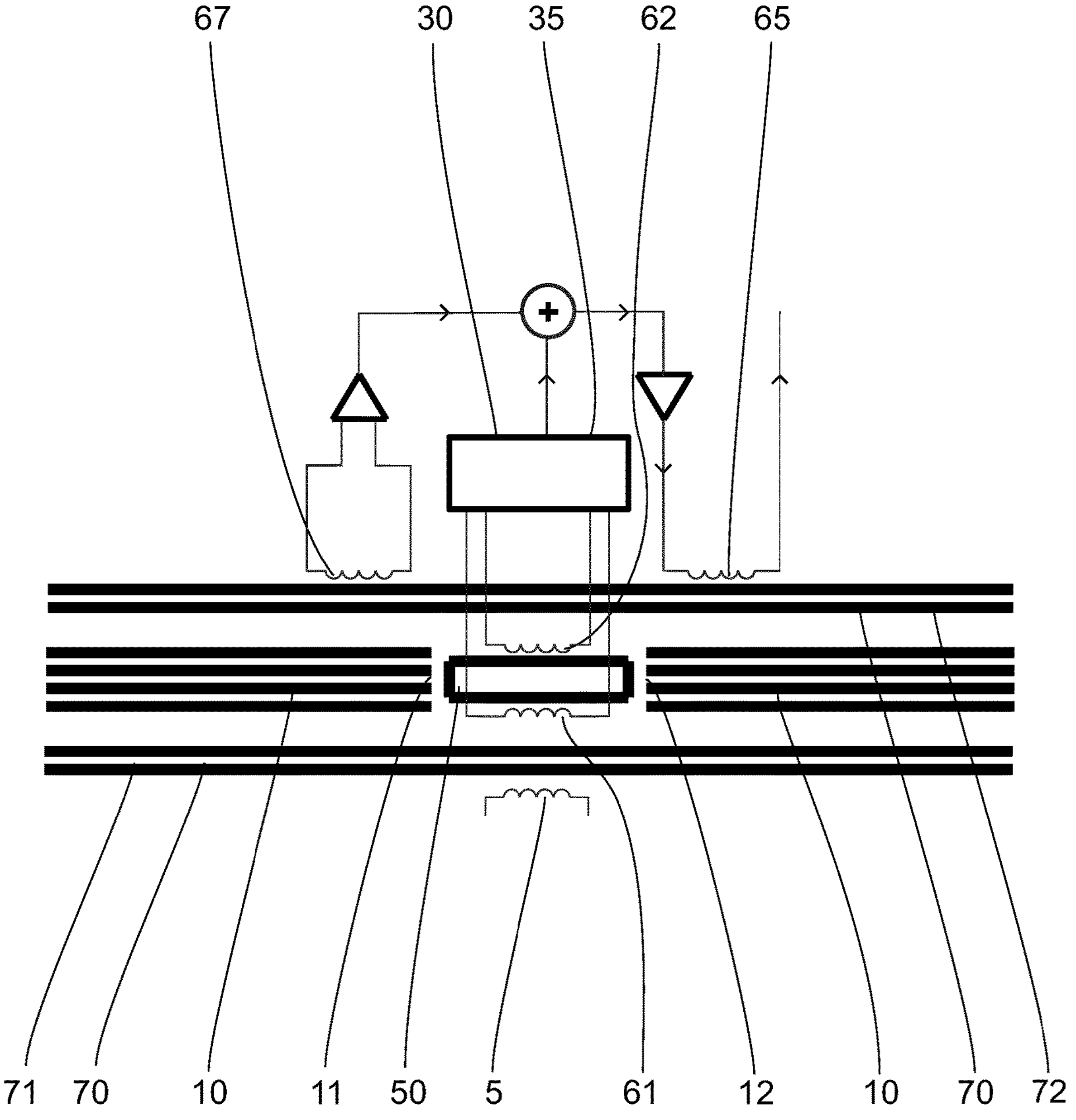
FIG. 2 is a schematic view of components and circuitry of the current transducer.

FIG. 2 is a schematic illustration of a current transducer 1 comprising additional components. The illustration shows part of the sensor core 10 in the region of the gap 13 where the fluxgate ring core 50 is located shown in a tangential cross section. Coils and circuits are shown as electronics diagrams.

The current transducer 1 of FIG. 2 still comprises a sensor core 10 and a fluxgate ring core 50 located in a gap 13 of the sensor core 10. An excitation flux is induced in the fluxgate ring core 50 via the first excitation coil 61 and the second excitation coil 62, which are driven by a drive means 35, which is in a preferred variant a modulator for modulating the signal. The first 61 and second excitation coil 62 are further connected to a detection circuit 30, which can determine the difference in current in the first excitation coil 61 and the second excitation coil 62 by using second harmonic detection.

The first excitation coil 61 and the second excitation coil 62 are both connected to a drive means 35. In a preferred embodiment, the drive means 35 is a modulator controlling the amplitude and the frequency of the alternating current driven through the first excitation coil 61 and the second excitation coil 62, respectively. The current driven through the first excitation coil 61 and the second excitation coil 62 gives rise to an excitation flux induced in the fluxgate ring core 50. Due to the symmetry of the magnetometer system, the first part of the fluxgate ring core, around which the first excitation coil 61 is wound, will reach saturation at the same time as the second part of the fluxgate ring core, around which the second excitation coil 62 is wound, when no primary flux is present. When a magnetic flux from the primary current of the current carrying conductor 5 is led from the sensor core 10 into the fluxgate ring core 50, the flux from the primary current will add to the excitation flux in one of the excitation coils 61,62 while subtracting from the excitation flux in the other excitation coil 61,62, leading to the first 61 and second excitation coil 62 reaching saturation at different times.

When the fluxgate ring core 50 is subjected to the primary magnetic flux, the alignment of the primary magnetic flux will be different with respect to the excitation flux induced by the first excitation coil 61 and the second excitation coil 62. Due to the difference in alignment, the primary flux will increase the total flux in one part of the fluxgate ring core 50 while decreasing it in the other part of the fluxgate ring core 50, thereby leading to a difference in time it takes before deep saturation is achieved in each side.

The first excitation coil 61 and the second excitation coil 62 are both connected to a detection circuit 30. The detection circuit detects the difference in current in the first excitation coil 61 and the second excitation coil 62 using second harmonic detection. The second harmonic detection improves the sensitivity of the current transducer 1 while simultaneously minimising the effect of temperature drift. As the first excitation coil 61 and the second excitation coil 62 are operated on the same fluxgate ring core 50, the temperature-induced property changes are nullified when subtracting the two signals.

In a preferred variant, the detection circuit 30 comprises additional processing capacity functioning as a processing unit which can compute the primary current based on the second harmonic detection.

It is a benefit of the present disclosure that sensor cores with different sizes may be used with the same magnetometer components, i.e. the fluxgate ring core 50 and excitation coils 61,62. Thereby, magnetometer components may be used and produced in the same manner for current transducers that are to be used to measure the primary current of various types of current carrying conductors.

The sensor core 10 may come in many different sizes capable of enclosing different current carrying conductors 5. In a preferred embodiment, the diameter of the sensor core opening 15 is in the range of 0.1-5 m, more preferred in the range of 0.2-1 m, such as around 0.5 m.

In preferred embodiment the dimensions of the fluxgate ring core 50 are small in comparison to the dimensions of the sensor core 10, as this makes the magnetometer less sensitive to noise. In a preferred embodiment, the diameter of the fluxgate ring core 50 is in the range of 0.5-50 mm, such as 1-10 mm, more preferred in the range of 5-10 mm such as 7 mm.

In the preferred embodiment of the current transducer 1 shown in FIG. 2, the sensor core 10, the fluxgate ring core 50, and the first excitation coil 61 and the second excitation coil 62 are encapsulated by the shielding 70. In the schematic cross-sectional view of FIG. 2, an inner shield core 71 and an outer shield core 72 are shown. Note that the schematic illustration is not to scale and that for example the thickness of the shield cores 71,72 relative to the sensor core 10, as well as the spacing between the shielding 70 and the sensor core 10 may be different than what is shown, just as it may vary for different preferred embodiments of the current transducer 1. It is to be understood that the shielding 70 further comprises a top shield plate and a bottom shield plate such that the sensor core 10, fluxgate ring core 50 and the first excitation coil 61 and the second excitation coil 62 are fully encapsulated. In one variant, the shielding 70 may be made from four pieces which can be fixedly or releasably mounted around the previously mentioned components. In other variants, some of the parts of the shielding 70 may be fixedly connected while others are releasable, e.g. the inner shield core 71 and the top shield plate are formed by a single piece, as is the outer shield core 72 and the bottom shield plate, while these two pieces may be releasably mounted around the sensor core 10, the fluxgate ring core 50, and the first excitation coil 61 and the second excitation coil 62, such that the shielding 70 can be removed to access the shielded components, e.g. for maintenance.

The shielding 70 is intended to protect the other components from external magnetic fields, such as the field from other electronics and/or the magnetic field of the Earth, such that the field sensed by the magnetometer is the field generated by the primary current.

In a preferred embodiment, the shielding 70 is made of a material with high saturation flux density. If the shielding 70 is fully saturated due to the external magnetic field, magnetic flux may pass the shielding 70 and disturb the magnetometer, hence it is preferable to make the shielding from a material with a saturation flux density high enough to withstand the external magnetic field without reaching saturation. Frequently, materials with high saturation flux density have a low relative permeability, therefore in some preferred variants of the current transducer 1, the shielding 70 is made from a material with lower relative permeability than the relative permeability of the sensor core 10 and the relative permeability of the fluxgate ring core 50. Such a preferred material used in some variants is electrical steel. In some variants, the shielding 70 is made from multiple materials, e.g. the top shield core and the bottom shield core being made from a different material than the inner shield core 71 and the outer shield core 72, such as the top shield core and the bottom shield core being cut from plate while the inner shield core and the outer shield core are made from wound ribbon.

In a preferred embodiment, the shielding is mounted such that the distance between the shielding 70 and the sensor core 10 and/or the fluxgate ring core 50 is at least twice the thickness of the shielding (note that FIG. 2 is not to scale). In some preferred embodiments, the distance between the shielding 70 and the sensor core 10 and/or the fluxgate ring core 50 is at least 1 mm. In some variants, the distance is achieved by at least two distance pieces made from non-magnetic material, those distance pieces being placed between the shielding 70 and the sensor core 10 to maintain a fixed distance between the shielding 70 and the sensor core 10. The distance between the shielding 70 and the sensor core 10 and/or the fluxgate ring core 50 limits the risk of magnetic flux being transferred from the shielding 70 to the sensor core 10 and/or fluxgate ring core 50, which would otherwise render the shielding 70 inefficient.

In the preferred embodiment shown in FIG. 2, the current transducer 1 further comprises a compensation coil 65. The compensation coil 65 is wound around the shielding 70. In a preferred embodiment, the compensation coil 65 is wound around all of the sensor core, such that the shielding is covered in evenly spaced windings of the compensation coil 65. In a more preferred embodiment, the compensation coil 65 is wound evenly around the shielding in the region of the fluxgate ring core 50. The compensation coil winding may be less evenly distributed around areas of the sensor core, e.g. such that the spacing of the windings is larger around the region of the sensor core than around the region of the fluxgate ring core 50. In some embodiments where the current transducer 1 is a split core current transducer, it may be necessary to increase the distance between windings of the compensation coil 65 close at the first and second split, respectively, such that the split core current transducer may be opened.

In a preferred embodiment, the compensation coil is connected to the detection circuit 30, such that the compensation current driving the compensation flux of the compensation coil 65 is determined to be proportional to the computed primary current. By determining the compensation current based on the computed primary current, it is possible to match the compensation flux to the primary magnetic flux such that the compensation flux outbalances the primary magnetic flux such that there is zero sensed total flux. Operating the magnetometer at zero flux enables the magnetometer to function when detecting a primary flux, which would otherwise be so high that it would saturate the magnetometer and make it incapable of detecting the flux. The compensation coil 65 is especially important for the magnetometer operated with a fluxgate ring core 50, as such magnetometers are nonlinear and saturate more quickly than for example linear magnetometer cores would.

In the preferred embodiment shown in FIG. 2, the current transducer 1 further comprises a feedback coil 67. In a preferred variant, the feedback coil 67 is wound around the shielding 70. The feedback coil 67 senses the combined alternating flux in the system. The detected signal from the feedback coil 67 is added to the magnetometer signal, thereby amplifying the signal of the alternating flux. Thereby, the feedback coil 67 improves the accuracy of the magnetic flux detected in the midrange frequency of fluctuations. The magnetometer is limited to detecting the magnetic flux where the primary current is a direct current or an alternating current fluctuating at low frequencies as the primary magnetic flux cannot be detected if the fluctuations are too fast with respect to the frequency of the excitation current driving the excitation flux. The frequency of the excitation flux is further limited by the saturation flux density and the amplitude of the excitation current, as the fluxgate ring core 50 needs to reach saturation in each direction within each period.

In an embodiment comprising both a compensation coil 65 and a feedback coil 67 wound around the outside of the shielding 70, the compensation coil 65 may be divided in two segments spaced apart, while the feedback coil 67 is wound around the shielding in a region between said segments of the compensation coil 65. In another embodiment comprising both a compensation coil 65 and a feedback coil 67 wound around the outside of the shielding 70, the compensation coil 65 may be wound around the shielding 70 first and the feedback coil 67 may be wound around both the shielding 70 and the compensation coil 65, such that the feedback coil 67 is wound on top of the compensation coil 65. In yet another embodiment, the feedback coil 67 may be wound around the shielding first and the compensation coil 65 may be wound around both shielding and compensation coil 67, such that the compensation coil 65 is wound on top of the compensation coil 67.

In all embodiments where both a compensation coil 65 and a feedback coil 67 are present, those coils are kept electrically separated, even when the coils are in physical contact.

In other embodiments, it is possible to have only one or a combination of some of the additional components, e.g. only shielding 70 without a compensation coil 65 or a feedback coil 67, or shielding in combination with a compensation coil 65 but without a feedback coil 67.

In a preferred embodiment not shown in any of the figures, the current transducer 1 comprises a degaussing circuit. The degaussing circuit is connected to the compensation coil 65 and enables a degaussing signal to be activated and driven through the compensation coil 65. The degaussing signal is an alternating current with a high amplitude, which can counteract remnant magnetic flux in the magnetic materials of the current transducer 1. In a preferred variant, the degaussing signal is manually activated by a user, as the user can determine when a degaussing signal is needed and when it will be least disruptive to the use of the current transducer 1, e.g. at a time when it is not critical to monitor the primary current.

In some embodiments, the current transducer 1 may comprise an outer shell 80 of a nonmagnetic material, e.g. a plastic material. This outer shell encloses components of the current transducer 1 to protect it from mechanical wear from the environment, as well as electrical signals and making it easy for the user to handle the current transducer 1. The outer shell may for example enclose the sensor core 10, the fluxgate ring core 50, the shielding 70 and all coils and circuits. The outer shell may further comprise a display for reading the output of the current transducer 1, ports for connecting to the current transducer for remote displaying and/or controls, e.g. for activating the degaussing signal.

In a preferred embodiment, the current transducer 1 is a split core current transducer. By a split core current transducer is understood a system where the closed loop of the sensor core 10 and fluxgate ring core 50 is reattachably broken. This enables the opening of the loop of the current transducer 1, after which it can be placed around a current carrying conductor 5. Subsequently, the of the current transducer 10 can be closed around the current carrying conductor 5. In one variant, the open ends of the sensor core may be structured to increase the surface area, where the parts on either side of the split are connected. In other variants, the split may comprise simple flat surfaces. In some preferred variants, the shielding and/or the outer shell may comprise connection means, such as a snap fit connection or latches for releasably securing the split core current conductor in the closed configuration.

Figure 3:
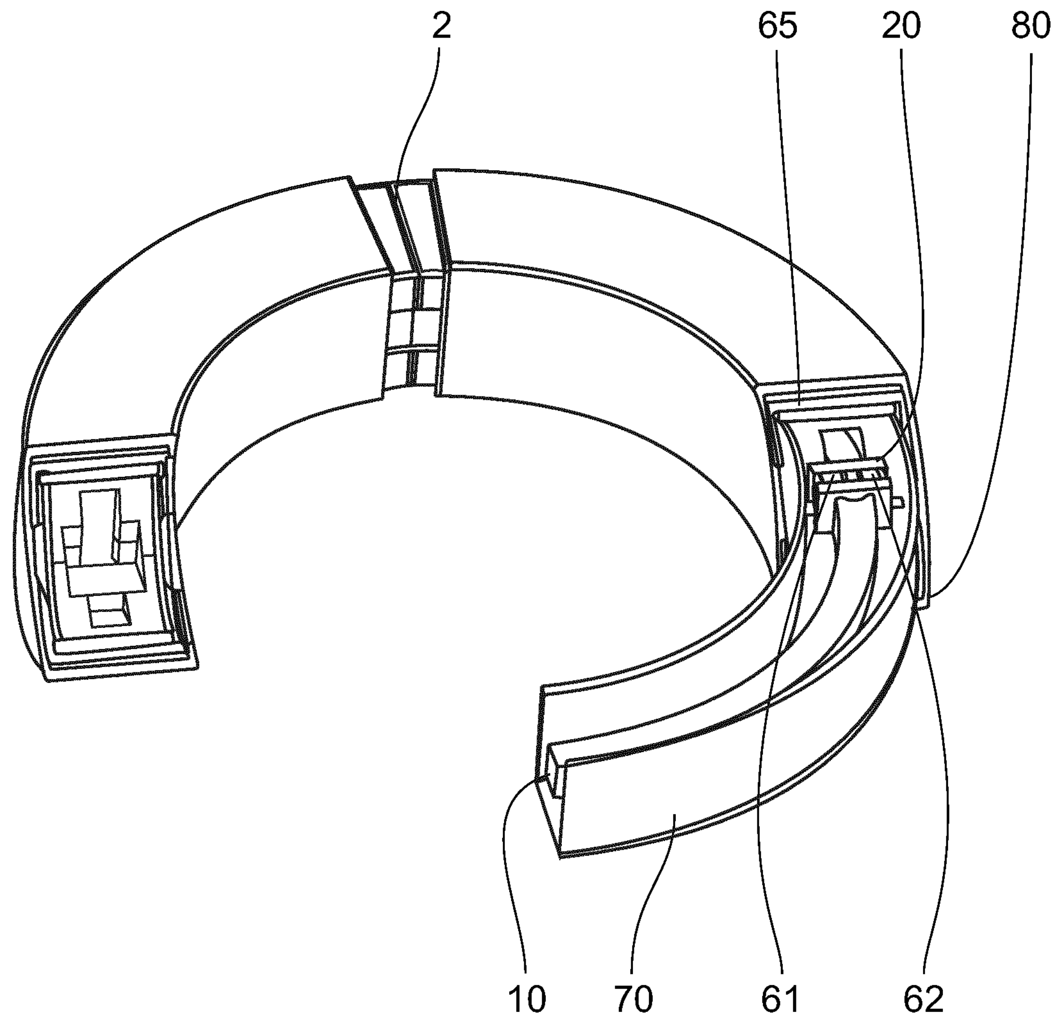
FIG. 3 is a schematic illustration of a current transducer shown in a partial cut-away view.

FIG. 3 shows a split core current transducer 1 in a partial cutaway view, showing various components and how they are placed in relation to each other.

In FIG. 3, it is made clear how the sensor core 10 is mounted such that it is surrounded by the shielding 70, which is in turn surrounded by a shell 80. The sensor core 10 is mounted such that it is spaced apart from the shielding 70, such that there is no direct physical contact between the sensor core 10 and the shielding 70. In preferred embodiments, a compensation coil 65 is mounted wound around the shielding 70, thus being located between the shielding 70 and the shell 80. In preferred embodiments, a feedback coil 67 is mounted wound around the shielding 70 thus being located between the shielding 70 and the shell 80. In more preferred embodiments, the current transducer 1 comprises both a compensation coil 65 and a feedback coil 67 located between the shielding 70 and the shell 80.

The fluxgate ring core with a first excitation coil 61 and a second excitation coil 62 wound around is mounted in the gap of the sensor core 10 and is held in place by mounting means 20.

The current transducer 1 shown in FIG. 3 is of the split core variety in the closed configuration. A single split 2 is visible in the cutaway view. At this split 2, the part of the current transducer 1 may be split and reattached allowing the current transducer to be opened. In a preferred embodiment as shown, the split 2 is located away from the magnetometer. The split 2 thus splits the sensor core 10, the shielding 70 and the shell 80 without disrupting the magnetometer components.

Figure 4:
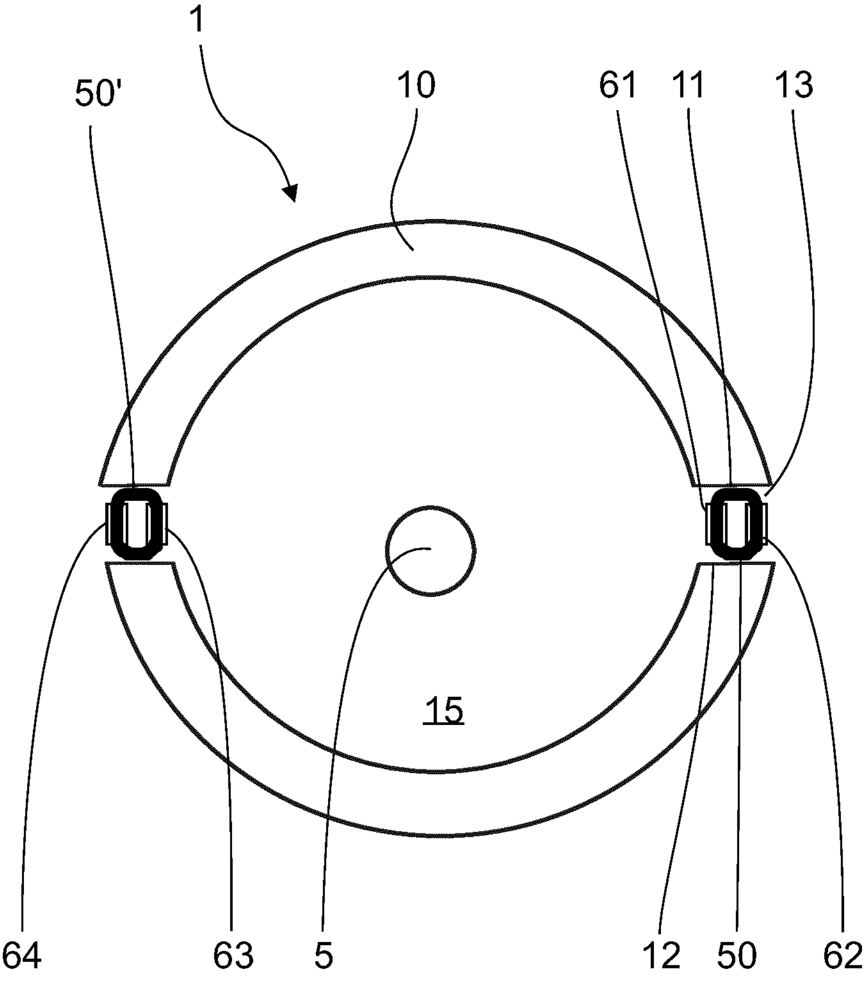
FIG. 4 is a schematic illustration of a cross-sectional view of a current transducer being placed around a current carrying conductor, the current transducer having two fluxgate ring cores.

FIG. 4. shows a schematic illustration of the components of a current transducer 1 having both a first fluxgate ring core 50 and a second fluxgate ring core 50', shown as a cross section.

The sensor core 10 is made from a magnetic material and forms a loop broken by a first gap 13 and a second gap. The first and second gaps are arranged directly across from each other, i.e. at opposite ends of a diagonal of the sensor core 10. By a loop is understood a structure where the beginning is connected to the end to form an enclosure. By the loop being broken by a gap is understood a structure which would have formed a loop, but where a segment has been removed. By the gap is understood the region between a first end of the sensor core 11 and a second end of the sensor core 12, such that the gap 13 is the volume, which the missing segment of the sensor core would have occupied, had the sensor core 10 been a closed loop with a continuous cross-sectional area from the first end of the sensor core 11 to the second end of the sensor core 12. This is the case for both the first gap and the second gap where the gap is the volume which would have been occupied by a segment of the sensor core 10 which would have occupied the space between a third and a fourth end of the sensor core 10 as the sensor core has been divided into two symmetric segments by the first and second gaps.

The sensor core 10 is placed around the current carrying conductor 5, such that part of the current carrying conductor 5 is located in the opening 15 of the sensor core 10. By the opening 15 of the sensor core 10 is understood the area delimited by the loop of the sensor core 10.

In a preferred embodiment, the sensor core 10 is circular. In other embodiments, the sensor core 10 may have another shape, such as square or hexagonal as long as the sensor core 10 is a regular shape which can be divided into two symmetric parts by a first and a second gap arranged directly opposite each other, such that the impact of an external field applied to the sensor core will be decreased by a first fluxgate ring core 50 arranged in the first gap 13 of the sensor core 10 and a second fluxgate ring core 50' arranged in the second gap of the sensor core.

The preferred arrangement and orientation of the first and second fluxgate ring cores within the first and second gaps is equivalent to what is discussed for other embodiments of the current transducer.

In preferred embodiments, the first fluxgate ring core 50 and the second fluxgate ring core 50' are constructed in the same manner including the geometry, material and arrangement of the excitation coils. In such embodiments, the first 50 and second fluxgate ring cores 50' including the excitation coils on the respective fluxgate ring cores may be of the same construction as described for other embodiments of the current transducer.

In a preferred embodiment, the first fluxgate ring core 50 and the second fluxgate ring core 50' along with any mounting means mechanically connect the ends of the segments of the sensor core 10, such that the current transducer 1 forms a looping structure. Mounting of the first 50 and second fluxgate ring core 50' may be performed in the same way and may be done in any of the manners described for other embodiments of the invention.

Some embodiments of the current transducer having a first and a second fluxgate ring core may be of the split core current transducer type. In such embodiments, the splits are preferably located as far as possible from the first and second fluxgate ring core, rotated 90 degrees along the loop of the current transducer relative to the fluxgate ring cores, such that the splits are equidistant from the fluxgate ring cores. This is preferrable as the shielding is broken at the splits, and thus the beneficial effects of the shielding is most important at the fluxgate ring cores when it remains uninterrupted in that region.

The operation principle behind the present embodiment of the current transducer having two fluxgate ring cores is equivalent to that described for other embodiments of the invention. The excitation coils may be connected in series, e.g. the first excitation coil of the first fluxgate ring core may be connected in series with the third excitation could of the second fluxgate ring core while the second excitation coil is connected in series with the fourth excitation coil, such that they may be connected to common drive means and detection circuit to form a common magnetometer. Excitation current is driven through the first and second fluxgate ring cores, preferably in a sufficient amount to drive the first and second fluxgate ring cores into deep magnetic saturation in the same manner as described for other embodiments of the invention.

LIST OF REFERENCE NUMBERS

1 Current transducer
5 Current carrying conductor
10 Sensor core
11 First end of the sensor core
12 Second end of the sensor core
13 Gap
15 Opening
30 Detection circuit
35 Drive means
50 Fluxgate ring core
50' Second fluxgate ring core
61 First excitation coil

62 Second excitation coil
63 Third excitation coil
64 Fourth excitation coil
65 Compensation coil
67 Feedback coil
70 Shielding
71 Inner shield core
72 Outer shield core

The invention claimed is:

1. A current transducer for measuring a magnetic flux from a current carrying conductor, the current transducer comprising:

a sensor core for concentrating magnetic flux from the current carrying conductor, the sensor core being shaped as a loop broken by a gap;

a fluxgate ring core for sensing the magnetic flux;

a first excitation coil for generating excitation flux in the fluxgate ring core and for detecting the magnetic flux of the current carrying conductor;

a second excitation coil for generating excitation flux in the fluxgate ring core and for detecting the magnetic flux of the current carrying conductor;

a modulator configured to drive an excitation current through the first excitation coil and the second excitation coil; and a detection circuit connected to the first excitation coil and the second excitation coil for detecting an electronic signal of the first and said second excitation coil, the fluxgate ring core being arranged in the gap of the sensor core, and the first excitation coil being wound around a first part of the fluxgate ring core, and the second excitation coil being wound around a second part of the fluxgate ring core.

2. The current transducer according to claim 1, wherein the detecting circuit comprises a second harmonic detector for demodulating a difference in the respective currents of the first excitation coil and the second excitation coil.

3. The current transducer according to claim 1, wherein the fluxgate ring core is made of a magnetic material with a relative permeability of at least 100.000.

4. The current transducer according to claim 3, wherein the fluxgate ring core is made of a cobalt based amorphous metal alloy.

5. The current transducer according to claim 1, wherein the sensor core is made of a magnetic material with a relative permeability lower than the relative permeability of the fluxgate ring core.

6. The current transducer according to claim 5, wherein the sensor core is made of Mu-metal.

7. The current transducer according to claim 1, further comprising shielding for protecting against external magnetic fields and reducing noise, the shielding encapsulating the sensor core, the fluxgate ring core, the first excitation coil, and the second excitation coil together.

8. The current transducer according to claim 7, wherein the shielding is made from a material with a lower relative permeability than that of the sensor core and that of the fluxgate ring core.

9. The current transducer according to claim 8, wherein the shield is made of electrical steel.

10. The current transducer according to claim 7, wherein the current transducer comprises a compensation coil for inducing a counteracting current and maintaining a near zero flux in the fluxgate ring core, the compensation coil being wound around the shielding around the sensor core.

11. The current transducer according to claim 10, wherein the current transducer comprises a degaussing circuit for removing remnant magnetic flux in the current transducer, the degaussing circuit being connected to the compensation coil.

12. The current transducer according to claim 1, wherein the current transducer comprises a second fluxgate ring core for sensing the magnetic flux, the second fluxgate being arranged directly across from the fluxgate ring core and being located in a second gap of the sensor core, the current transducer further comprising:

a third excitation coil for generating excitation flux in the second fluxgate ring core and for detecting the magnetic flux of the current carrying conductor; and a fourth excitation coil for generating excitation flux in the second fluxgate ring core and for detecting the magnetic flux of the current carrying conductor.

13. The current transducer according claim 1, wherein the current transducer is a split core current transducer.

14. The current transducer according to claim 1, wherein the current transducer comprises a feedback coil for improving an accuracy of the current transducer.

15. A method for detecting a primary current flow through a current carrying conductor, the method comprising:

providing the current carrying conductor for carrying the primary current;

providing a current transducer comprising a sensor core, a fluxgate ring core, a first excitation coil and second excitation coil;

placing the sensor core around the current carrying conductor such that the sensor core senses magnetic flux emitted from the current carrying conductor;

connecting the first excitation coil and the second excitation coil to a modulator and driving excitation current through the first and the second excitation coil such that an excitation flux is induced in the fluxgate ring core;

connecting the first excitation coil and the second excitation coil to a detection circuit and using second harmonic detection to determine a difference in current through the first excitation coil and the second excitation coil; and computing the primary current of the current carrying conductor based on the second harmonic detection of the difference in current.

16. The method according to claim 15, further comprising:

driving excitation current through a third excitation coil and a fourth excitation coil provided in a second fluxgate ring core of the current transducer, such that an excitation flux is induced in the second fluxgate ring core; and connecting the third excitation coil and the fourth excitation coil in series with the first excitation coil and the second excitation coil, such that the third excitation coil and the fourth excitation coil are connected to the detection circuit, wherein the difference in current is determined between a first combined system of the first excitation coil and the third excitation coil and a second combined system of the second excitation coil and the fourth excitation coil.

17. The method according to claim 15, wherein the excitation current driven through the first and the second excitation coils is an alternating current.

18. The method according to claim 15, further comprising:

providing a compensation coil around the sensor core; and driving a compensation current through the compensation coil, the compensation current being determined based on an output of the detection circuit such that a primary flux of the primary current is compensated by a compensation flux of the compensation current through the compensation coil.

19. The method according to claim 18, further comprising sending a degaussing signal through the compensation coil for removing remnant magnetic flux residing in materials of the current transducer.

* * * * *